US012768736B2

(12) United States Patent
Mimura et al.

(10) Patent No.: US 12,768,736 B2
(45) Date of Patent: Oct. 20, 2026

(54) ROTARY MACHINE DIAGNOSTIC DEVICE AND ROTARY MACHINE DIAGNOSTIC METHOD

(71) Applicant: TOSHIBA ENERGY SYSTEMS & SOLUTIONS CORPORATION, Kawasaki (JP)

(72) Inventors: Yuki Mimura, Kawasaki Kanagawa (JP); Toshio Hirano, Yokohama Kanagawa (JP); Yuichiro Gunji, Yokohama Kanagawa (JP); Koji Ando, Yokohama Kanagawa (JP); Yasuo Kabata, Yokohama Kanagawa (JP); Masafumi Fujita, Yokohama Kanagawa (JP)

(73) Assignee: TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 393 days.

(21) Appl. No.: 18/523,403

(22) Filed: Nov. 29, 2023

(65) Prior Publication Data

US 2024/0183737 A1 Jun. 6, 2024

(30) Foreign Application Priority Data

Dec. 2, 2022 (JP) ................................ 2022-193546

(51) Int. Cl.
*G01M 1/22* (2006.01)
*G01R 31/34* (2020.01)

(52) U.S. Cl.
CPC ............ *G01M 1/22* (2013.01); *G01R 31/343* (2013.01)

(58) Field of Classification Search
CPC .............................. G01M 1/22; G01R 31/343
(Continued)

(56) References Cited

U.S. PATENT DOCUMENTS 5,209,116 A 5/1993 Okumura
2008/0289416 A1 11/2008 Thelen
(Continued)

FOREIGN PATENT DOCUMENTS

CN 103913272 A 7/2014
EP 0 969 274 A2 1/2000
(Continued)

OTHER PUBLICATIONS

Shiraishi et al., JP6906985 B2, "Vibration Diagnosis System, Vibration Diagnosis Method And Parameter Setting Method", date Published: Jul. 21, 2021. (Year: 2021).*
(Continued)

*Primary Examiner* — John H Le
(74) *Attorney, Agent, or Firm* — Foley & Lardner LLP

(57) ABSTRACT

According to an embodiment, a rotary machine diagnostic device comprises: an input unit that receives calculation condition data and a measured state value of the rotating part, the calculation condition data including reference data and an influence coefficient matrix, and the measured state value including vibration data, a rotation speed, and phase calculation data serving as a basis for phase calculation; a calculation unit that performs an calculation operation of identifying a vibration mode serving as a basis for the specification of the failure occurrence place and the inference of the failure cause, based on the calculation condition data and the measured state value which are received by the input unit; a storage unit in which the calculation condition data, the measured state value, and the vibration mode which is obtained by the calculation unit are loaded; and an output unit that outputs and displays the contents loaded in the storage unit.

3 Claims, 17 Drawing Sheets

(58) Field of Classification Search
USPC ............................................................. 702/56
See application file for complete search history.

(56) References Cited

U.S. PATENT DOCUMENTS

| | | | |
|---|---|---|---|
| 2018/0180515 | A1 | 6/2018 | Gandhi et al. |
| 2019/0195680 | A1 | 6/2019 | Saburi et al. |

FOREIGN PATENT DOCUMENTS

| | | | |
|---|---|---|---|
| JP | S57-045416 | A | 3/1982 |
| JP | S59-200938 | A | 11/1984 |
| JP | S61-247928 | A | 11/1986 |
| JP | H03-279836 | A | 12/1991 |
| JP | 3834228 | B2 | 10/2006 |
| JP | 2010-048588 | A | 3/2010 |
| JP | 2019-113364 | A | 7/2019 |
| JP | 2021-179316 | A | 11/2021 |

OTHER PUBLICATIONS

AU Examination Report 1 in AU Appl. Ser. No. 2023266230 dated Sep. 19, 2024 (7 pages).
JP Office Action for Japanese Patent Application No. 2022-193546 dated Nov. 11, 2025 (5 pages).

* cited by examiner

FIG. 17

126a

| | | Determination parameter | | | Combination result | | |
|---|---|---|---|---|---|---|---|
| | | vi | βi | αi | Thermal vibration | Cyclic vibration (hard rub) | Cyclic vibration (Soft rub) |
| Thermal vibration | | $v_i \geqq v_{t0}$ | $\beta_i \leqq \beta_0$ | — | Add 1 | 0 | 0 |
| Cyclic vibration | Hard rub | $v_i \geqq v_{c0}$ | $\beta_i \geqq \beta_0$ | $\alpha i \geqq \alpha_0$ | 0 | Add 1 | 0 |
| | Soft rub | | | $\alpha i < \alpha_0$ | 0 | 0 | Add 1 |
| Correspond to none | | $v_i < v_{t0}$ and $\beta_i < \beta_0$ or $v_i < v_{c0}$ and $\beta_i \geqq \beta_0$ | | — | 0 | 0 | 0 |

FIG. 18

126b

| | | Determination conditions |
|---|---|---|
| Comprehensive determination | Thermal vibration determination | Maximum value of thermal vibration determination results in bearings and directions |
| | Cyclic vibration (Hard rub) determination | Maximum value of cyclic vibration (hard rub) determination results in bearings and directions |
| | Cyclic vibration (Soft rub) determination | Maximum value of cyclic vibration (soft rub) determination results in bearings and directions |
| | Determination result in case evaluation (X) | (a) the number of the 0 determinations is 0 or 1 ⇒ 1 is added to "x" of the determination in the cause evaluation<br>(b) number of the 0 determinations is 2 or 3, ⇒ Determination resultsX = 0 |

FIG. 19

126c

| determination result in cause evaluation | determination results of vibrations other than thermal vibration | process |
|---|---|---|
| 0 | cyclic vibration (Hard rub) determination = 0 and cyclic vibration (soft rub) determination = 0 and Thermal vibration determination = 0 | Output Nothing done |
| | cyclic vibration (Hard rub) determination > 0 or cyclic vibration (soft rub) determination > 0 or Thermal vibration determination > 0 | to unbalance position inferring step |
| 1 or 2 | | Output Nothing done |
| > 3 | | Output undeterminable |

ROTARY MACHINE DIAGNOSTIC DEVICE AND ROTARY MACHINE DIAGNOSTIC METHOD

CROSS-REFERENCE TO RELATED APPLICATION

This application is based upon and claims the benefit of priority from Japanese Patent Application No. 2022-193546 filed on Dec. 2, 2022, the entire content of which is incorporated herein by reference.

FIELD

Embodiments of the present invention relate to a rotary machine diagnostic device and a rotary machine diagnostic method.

BACKGROUND

Aiming at a higher operation rate of equipment in power plants, the development of a power plant failure diagnostic system using IoT (Internet of Things) technologies is under consideration. What becomes a problem in the appropriate execution of such a failure diagnosis, however, is how to construct a database and algorithm for accurately detecting a failure or a failure sign from measurement data.

As a first example aiming at state monitoring, there has been conventionally known a system that has a sensor, typically a vibration sensor, attached to a device to be monitored and specifies an abnormal place of the device based on measurement data obtained from the sensor. A known example thereof is an abnormality diagnostic system including a vibration detection sensor installed on a rotary machine to be diagnosed, an calculation processor that converts a detection signal from the vibration detection sensor into vibration data, and an information processor that performs a diagnosis based on the vibration data from the calculation processor.

As a second example, there is known an abnormality detecting device that includes a plurality of shaft vibration sensors for measuring values of the vibration and rotation angle of a rotary shaft, and based on the measurement values, calculates a vibration vector presenting a rotation angle and a magnitude of the vibration at which the vibration of the rotary shaft is largest, and infers an abnormality occurrence position in the axial direction of the rotary shaft based on a time change of the vibration vector.

Shaft vibration observed during the operation of a turbine generator is caused by various factors and has frequency components corresponding to these factors. Further, the shaft vibration is mostly vibration having a rotation synchronous component accompanying a balance state change that is caused by a change in weight unbalance, a change in shaft bending during operation, or the like depending on a mode of a failure occurring in each position of a rotating part.

The unbalance distribution of the rotating part is usually unknown, but measuring the amplitude and phase of vibration of the rotating part during operation enables the estimation of the distribution, and by inferring at which place on the rotating part the unbalance has occurred and what is a failure event/cause that has led to the unbalance, it is possible to take a necessary measure in a short time, leading to a higher operation rate of the plant.

The first example of the abnormality diagnostic system described above converts data regarding one type of frequency generated during the operation of the rotary machine to generate one conversion data, and specifies a cause of the abnormality based on the conversion data, but even the same frequency may be ascribable to a plurality of abnormality causes, and this configuration makes it difficult to specify the abnormality cause.

The second example of the abnormality diagnostic system described above, similarly to the first example, infers an abnormal place regarding a variety of abnormal events occurring in the rotary shaft, by comparing a vibration vector when the abnormality actually occurred at a specific place in the rotating part of the target machine or of the same type of machine with the present vector. This does not enable the abnormality detection unless there is actual data regarding the abnormality event or if the machine is newly installed.

BRIEF DESCRIPTION OF THE DRAWINGS

FIG. 17 is a first determination table illustrating determination conditions in a failure occurrence place specifying and diagnosing method during rated rotation speed operation, in the rotary machine diagnostic method according to the third embodiment.

FIG. 18 is a second determination table illustrating determination conditions in the failure occurrence place specifying and diagnosing method during rated rotation speed operation, in the rotary machine diagnostic method according to the third embodiment.

FIG. 19 is a third determination table illustrating determination conditions in the failure occurrence place specifying and diagnosing method during rated rotation speed operation, in the rotary machine diagnostic method according to the third embodiment.

DETAILED DESCRIPTION

It is an object to provide a rotary machine diagnostic device and a rotary machine diagnostic method that are capable of specifying a failure occurrence place and inferring a failure cause, regarding an unbalance occurrence event that a rotating part undergoes during the operation of a rotary machine.

According to an aspect of the present invention, there is provided a rotary machine diagnostic device for specifying a failure occurrence place and inferring a failure cause, regarding an unbalance occurrence event that a rotating part undergoes during a period when a rotary machine is operating, the device comprising: an input unit that receives calculation condition data and a measured state value of the rotating part, the calculation condition data including reference data and an influence coefficient matrix, and the measured state value including vibration data, a rotation speed, and phase calculation data serving as a basis for phase calculation; a calculation unit that performs an calculation operation of identifying a vibration mode serving as a basis for the specification of the failure occurrence place and the inference of the failure cause, based on the calculation condition data and the measured state value which are received by the input unit; a storage unit in which the calculation condition data, the measured state value, and the vibration mode which is obtained by the calculation unit are loaded; and an output unit that outputs and displays the contents loaded in the storage unit.

Rotary machine diagnostic devices and rotary machine diagnostic methods according to embodiments of the present invention will be hereinafter described with reference to the drawings. Here, the same or similar parts will be denoted by common reference signs and a redundant description thereof will be omitted.

First Embodiment

Figure 1:
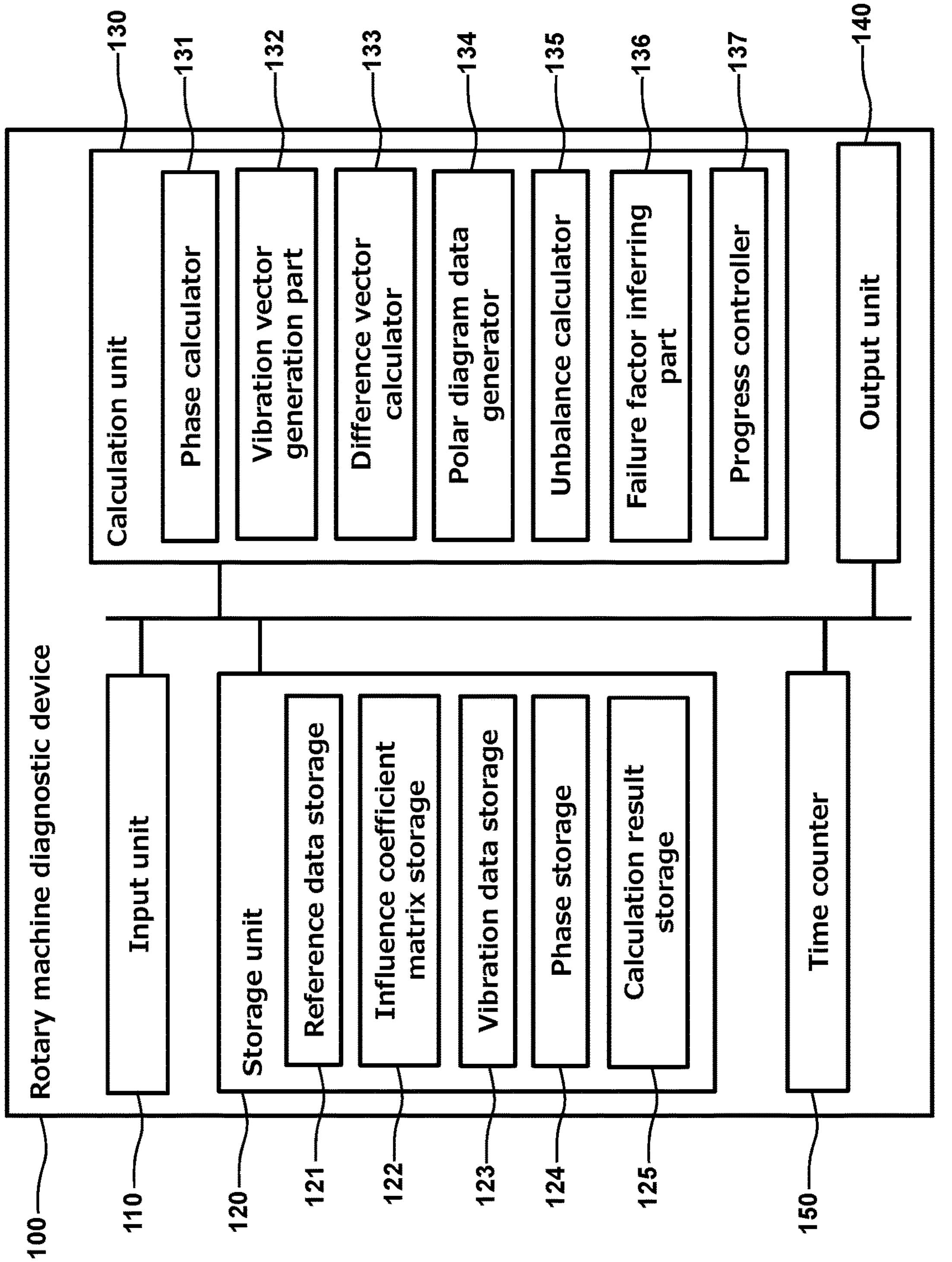
FIG. 1 is a block diagram illustrating the configuration of a rotary machine diagnostic device according to a first embodiment.

FIG. 1 is a block diagram illustrating the configuration of a rotary machine diagnostic device 100 according to a first embodiment.

The rotary machine diagnostic device 100 has an input unit 110, a storage unit 120, a calculation unit 130, an output unit 140, and a time counter 150.

The input unit 110 receives calculation condition data and measured state values as inputs. Here, the calculation condition data is information necessary for calculation operation by the calculation unit 130. The calculation condition data includes, for example, reference data and an influence coefficient matrix which will be described later, and various determination reference values necessary for determination in the progress of diagnosis execution by the rotary machine diagnostic device 100. The measured state values are outputs of detectors that measure the states of a rotating part 10*a* (FIG. 2) of a rotary machine 10, and include vibration data, a rotation speed, phase calculation data serving as a basis for phase calculation, and a power/load of the rotary machine 10. Here, the vibration data is, for example, amplitude values measured at sampling-time intervals. These will be described in detail later with reference to FIG. 2.

The storage unit 120 has a reference data storage 121, an influence coefficient matrix storage 122, a vibration data storage 123, a phase storage 124, and an calculation result storage 125.

The reference data storage 121 and the influence coefficient matrix storage 122 respectively store the reference data and the influence coefficient matrix which are received by the input unit 110. The vibration data storage 123 stores the vibration data received by the input unit 110. The phase storage 124 stores the phase calculation data serving as a basis for phase calculation and the rotation speed which are received by the input unit 110. The calculation result storage 125 stores the results of the calculation operation executed by the calculation unit 130, that is, stores vibration vectors, vibration vector differences, polar diagram data, unbalance distribution, a vibration mode, and so on.

The calculation unit 130 performs an calculation operation for specifying a failure occurrence place in the rotary machine 10 and inferring a failure cause, based on the calculation condition data and the measured state values which are received by the input unit 110. The calculation unit 130 has a phase calculator 131, a vibration vector generator 132, a difference vector calculator 133, a polar diagram data generator 134, an unbalance calculator 135, a failure cause inferring part 136, and a progress controller 137.

The phase calculator 131 calculates the phase of the rotating part 10*a* based on the phase calculation data. This will be described in detail later with reference to FIG. 7.

The vibration vector generator 132 generates the vibration vector based on the vibration data. The generated vibration vector is loaded and saved in the calculation result storage 125.

The difference vector calculator 133 calculates the vibration vector difference from the vibration vectors. The calculated vibration vector difference is loaded and saved in the calculation result storage 125.

The polar diagram data generator 134 generates polar diagram data, using the phases calculated by the phase calculator 131 and the vibration vectors generated by the vibration vector generator 132. The generated polar diagram data is loaded and saved in the calculation result storage 125.

The unbalance calculator 135 calculates the unbalance distribution of the rotating part 10*a* based on the vibration vectors generated by the vibration vector generator 132 and the influence coefficient matrix stored in the influence coefficient matrix storage 122. The calculated unbalance distribution is loaded and saved in the calculation result storage 125.

The failure cause inferring part 136 identifies/infers a failure cause that is a cause of the vibration of the rotating part 10*a*, based on the calculation results stored in the storage unit 120. The failure cause inferring part 136 stores determination values for identification included in the calculation condition data received by the input unit 110.

The progress controller 137 governs the progress of a sequence of operations of the elements of the rotary machine diagnostic device 100. In other words, it performs the determination necessary for the progress of the procedure of the rotary machine diagnostic method and gives the elements instructions for proceeding to the next step. The progress controller 137 stores the determination reference values necessary for the determination which values are read by the input unit 110, and uses them for the determination by the progress controller 137.

Figure 2:
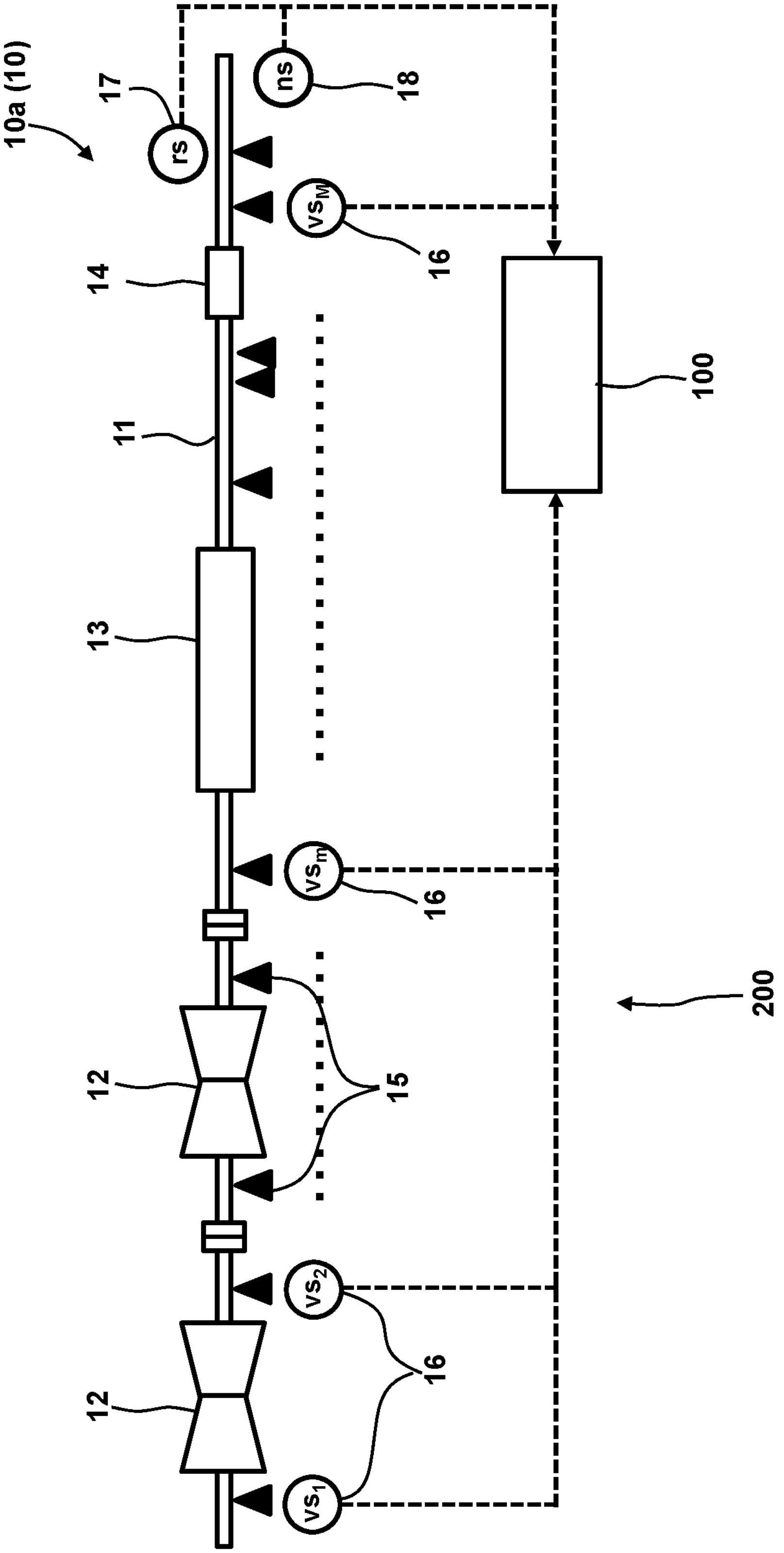
FIG. 2 is a conceptual view illustrating an example of a rotating part of a rotary machine to which the rotary machine diagnostic device according to the first embodiment is applied.

FIG. 2 is a conceptual view illustrating an example of the rotating part 10*a* of the rotary machine 10 to which the rotary machine diagnostic device 100 according to the first embodiment is applied.

In FIG. 2, an example where the rotary machine 10 is a steam turbine and a generator is illustrated. The rotating part 10*a* has two low-pressure turbines 12, a generator 13, an exciter 14, and a rotor shaft 11 connecting these in series. It should be noted that the rotary machine 10 is not limited to this. The rotating part 10*a* is rotatably supported by a plurality of bearings 15.

Near the bearings 15, vibrometers 16 are disposed. The vibrometers 16 are denoted by $vs_i$ (i=1 to M). Further, a phase detector 17 and a rotation counter 18 are provided to face the rotating part 10*a*. The rotary machine diagnostic device 100, the vibrometers 16, the phase detector 17, and the rotation counter 18 constitute a rotary machine diagnostic system 200.

Figure 3:
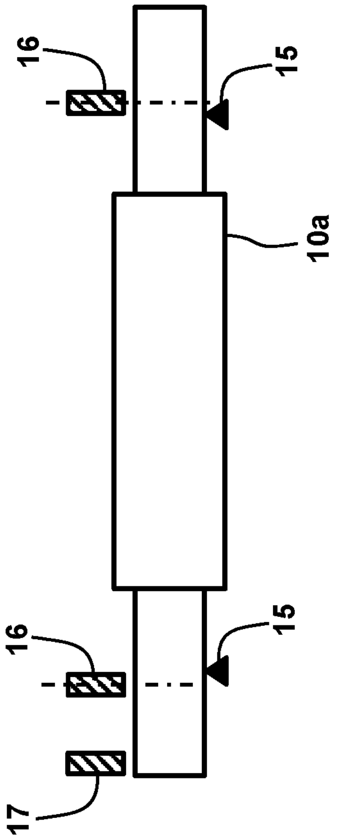
FIG. 3 is a conceptual view illustrating vibrometers and a phase detector for the rotating part of the rotary machine to which the rotary machine diagnostic device according to the first embodiment is applied.
Figure 4:
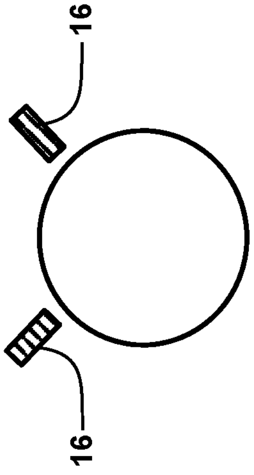
FIG. 4 is a conceptual view illustrating the vibrometers for the rotating part of the rotary machine to which the rotary machine diagnostic device according to the first embodiment is applied.

FIG. 3 is a conceptual view illustrating the vibrometers 16 and the phase detector 17 for the rotating part 10*a* of the rotary machine 10 to which the rotary machine diagnostic device 100 according to the first embodiment is applied. FIG. 4 is a conceptual view illustrating the vibrometers 16 for the rotating part 10*a* of the rotary machine 10 to which the rotary machine diagnostic device according to the first embodiment is applied.

The vibrometers 16 output time-changes of vibrations at their detection positions. The vibrometers 16 are, for example, non-contact displacement sensors such as eddy-current non-contact sensors that measure gaps (spaces) between the rotating part 10*a* and the vibrometers 16.

In FIG. 4, an example where the two vibrometers 16 are disposed at the same place in terms of the axial direction to make a 90-degree angle is illustrated. It should be noted that their direction may be a direction perpendicular to the horizontal direction, or the like, and their angle is not limited to 90 degrees. Thus, the plurality of vibrometers 16 different in direction (direction toward the axial center, angle) may be disposed at the same place in terms of the axial direction. In this case, (i) in $vs_i$ are given different numbers.

Figure 5:
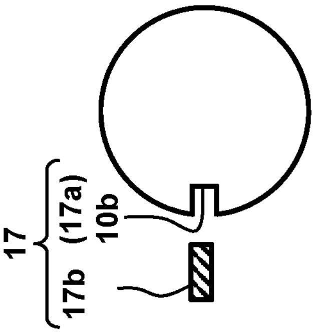
FIG. 5 is a conceptual view illustrating a first example of the phase detector for the rotating part of the rotary machine to which the rotary machine diagnostic device according to the first embodiment is applied.
Figure 6:
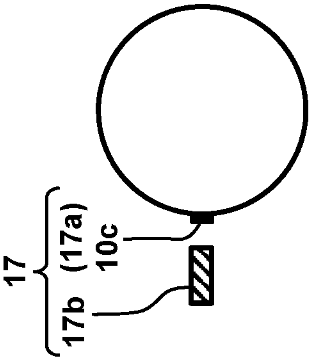
FIG. 6 is a conceptual view illustrating a second example of the phase detector for the rotating part of the rotary machine to which the rotary machine diagnostic device according to the first embodiment is applied.

FIG. 5 is a conceptual view illustrating a first example of the phase detector 17 for the rotating part 10*a* of the rotary machine 10 to which the rotary machine diagnostic device 100 according to the first embodiment is applied. FIG. 6 is a conceptual view illustrating a second example of the phase detector 17 for the rotating part 10*a* of the rotary machine 10 to which the rotary machine diagnostic device 100 according to the first embodiment is applied.

Typically, the position of the phase detector 17 in terms of the axial direction of the rotating part 10*a* is slightly more outward than the vibrometers 16 as illustrated in FIG. 3. The phase detector 17 detects the rotation angle of the rotating part 10*a*, in other words, its phase.

The phase detector 17 is a generic term for a reference marker 17*a* dusposed at one circumferential position of the outer peripheral surface of the rotor shaft 11 of the rotating part 10*a* and a pulse detector 17*b* disposed near the reference marker 17*a*, for instance. Here, for example, the reference marker 17*a* in the first example illustrated in FIG. 5 is a slit 10*b* formed in the surface of the rotating part 10*a*, and the reference marker 17*a* in the second example illustrated in FIG. 6 is a reflective tape 10*c* pasted on the surface of the rotating part 10*a*.

The pulse detector 17*b* detects one pulse every time the rotating part 10*a* makes one rotation. That is, the phase detector 17 outputs one pulse every time the rotating part 10*a* makes one rotation. In the case where the time counter 150 counts J times in $\Delta T$, which is a pulse generation time interval, a phase $\alpha$ (degree) at the $j^{th}$ count and after a time $\Delta t$ elapses from the previous pulse generation is calculated by the following formula (1).

$$\alpha = 360 \cdot (\Delta t / \Delta T) = 360 \cdot (j / J) \tag{1}$$

By the above calculation operation, the phase calculator 131 calculates the phase that the rotating part 10*a* has when a peak value of the output (time-change of the amplitude) of each of the vibrometers 16 occurs. Here, the phase calculation data refers to a pulse signal in this example but is not limited to this if the same calculation operation can be done based on this.

The rotation counter 18 is disposed at an end of the rotor shaft 11. The rotation counter 18 is a generic term for a gear (not illustrated) disposed on the rotor shaft 11 and a rotation speed detector (not illustrated) disposed on a stationary side near the gear. The rotation speed detector converts a change in magnetic permeability due to the ruggedness of the gear into the pulse signal to output it.

Figure 7:
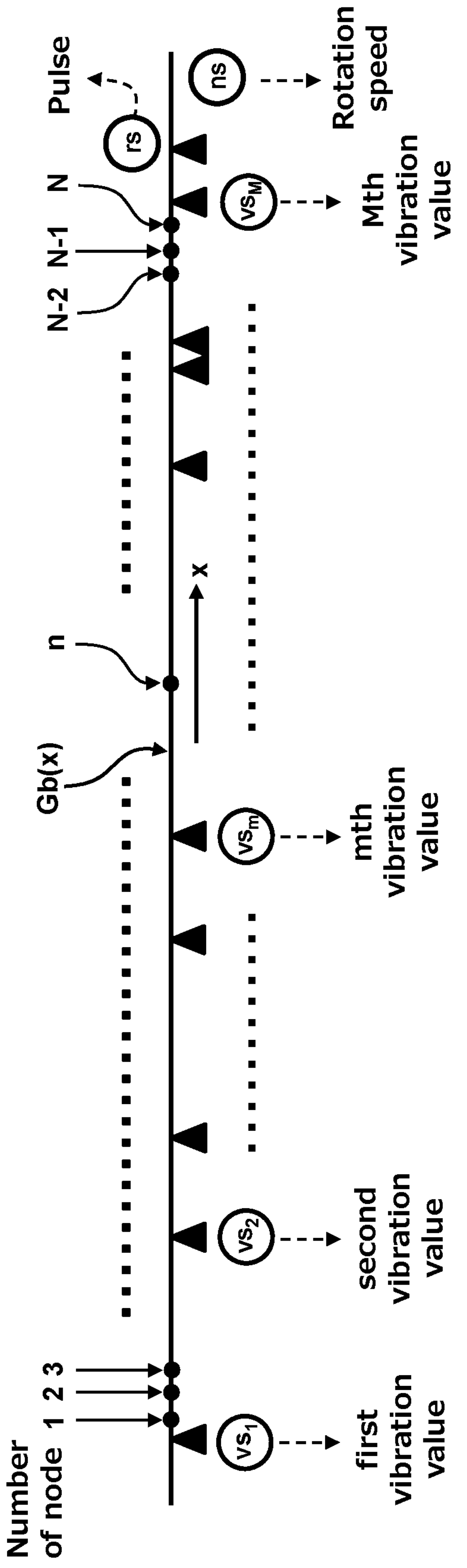
FIG. 7 is an explanatory chart of a model in the example of the rotating part of the rotary machine to which the rotary machine diagnostic device according to the first embodiment is applied.

FIG. 7 is an explanatory chart of a model in the example of the rotating part 10*a* of the rotary machine 10 to which the rotary machine diagnostic device 100 according to the first embodiment is applied. In FIG. 7, the rotating part 10*a* is simulated using out-of-plane bending stiffness Gb(x) that depends on x extending along the axial direction x and a plurality of nodes n (n=1 to N) accompanying the bending stiffness Gb(x) and distributing along the axial direction x.

Figure 8:
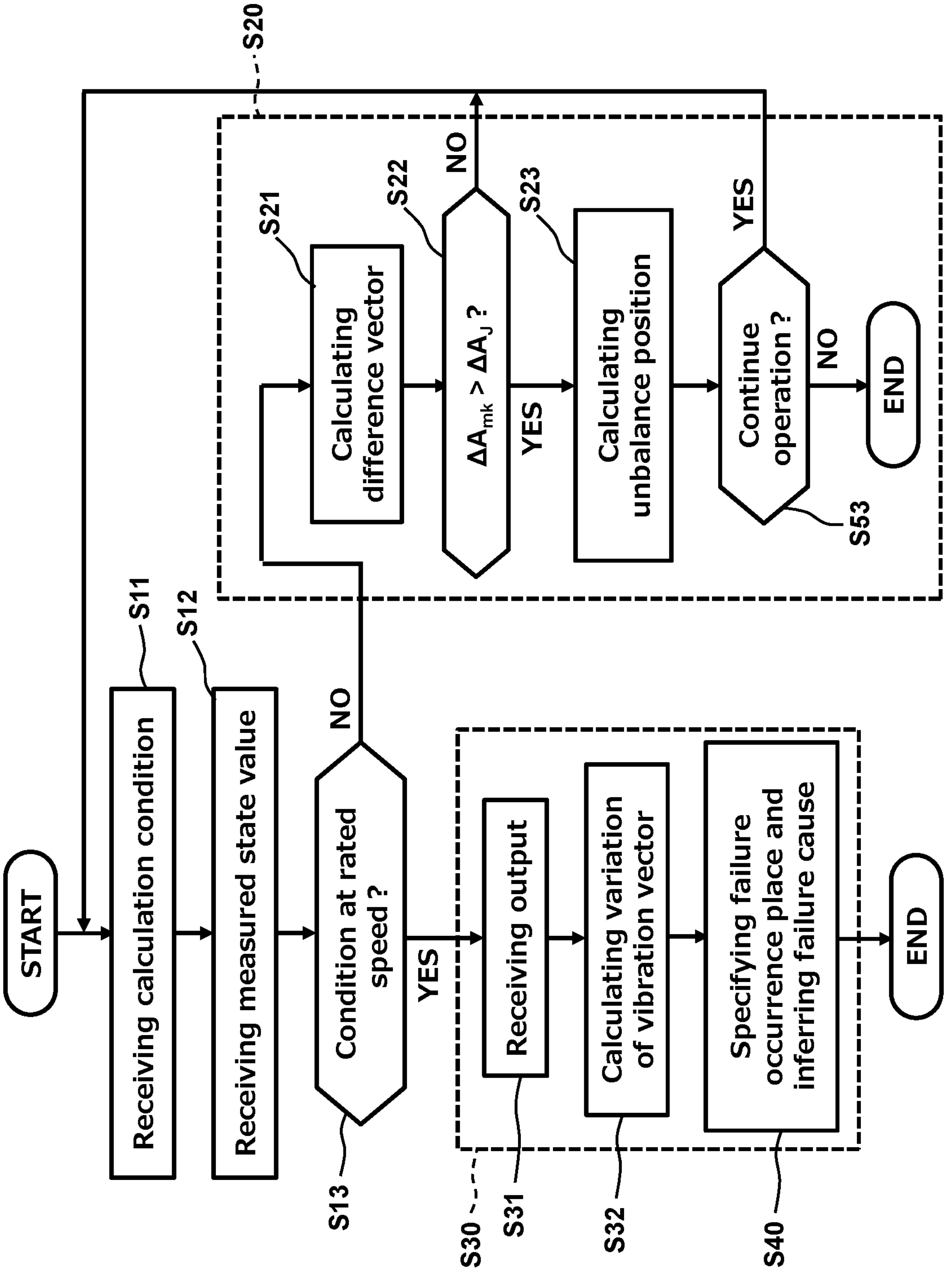
FIG. 8 is a flowchart illustrating the whole procedure of a rotary machine diagnostic method according to the first embodiment.

FIG. 8 is a flowchart illustrating the whole procedure of a rotary machine diagnostic method according to the first embodiment.

First, the rotary machine diagnostic device 100 reads the calculation condition data (step S11). In more detail, the input unit 110 receives, as inputs, the calculation condition data including the reference data, the influence coefficient matrix A, and the various determination reference values. The reference data and the influence coefficient matrix are stored in the reference data storage 121 and the influence coefficient matrix storage 122 respectively. The various determination reference values are loaded in the progress controller 137.

Next, the rotary machine diagnostic device 100 reads the measured state values (step S12). In more detail, the input unit 110 receives, as inputs, the outputs of the detectors that measure the states of the rotating part 10*a* of the rotary machine 10, including the vibration data, the rotation speed, and the phase calculation data serving as a basis for phase calculation. The phase calculator 131 calculates the phase of the rotating part 10*a* based on the phase calculation data and the output of the time counter 150. The vibration data received by the input unit 110 is stored in the vibration data storage 123. The rotation speed received by the input unit 110 and the phase calculated by the phase calculator 131 are stored in the phase storage 124.

Next, the progress controller 137 determines whether or not the rotary machine 10 to be diagnosed is in rated rotation speed operation (step S13). Here, the rated rotation speed operation is an operation at a rated rotation speed other than an operation while the rotation speed is increasing or decreasing. That is, the rated rotation speed operation refers to a state in which the rotation speed reaches the rated rotation speed after increasing, a state in which the rotation speed is the rated rotation speed before decreasing, or if the rotary machine 10 is a power generating device, the rated rotation speed operation is a state in which, for example, it is connected to an electric power grid system and is burdened with a load synchronously with the electric power grid system. If the rotary machine 10 is an electric motor or the like, the rated rotation speed operation refers to a state in which it is connected to a pump, an air blower, or the like being a load to drive it.

In the case where the progress controller 137 determines that the rotary machine 10 is not in the rated rotation speed operation (NO in step S13), the flow goes to diagnosis step S20 during start-up/shut-down process. In the case where the progress controller 137 determines that the rotary machine 10 is in rated rotation speed operation (YES in step S13), the flow goes to diagnosis step S30 during rated rotation speed operation.

First, diagnosis step S20 during start-up/shut-down process will be described below.

In diagnosis step S20 during start-up/shut-down process, a difference vector which is a time-change amount of the vibration vector is first calculated (step S21). Hereinafter, a first step and a second step of the calculation of the change in the vibration vector will be described in sequence. In the first step, the vibration vector generator 132 generates the vibration vectors and in the second step, the difference vector calculator 133 calculates the vibration vector difference.

First, the first step of generating the vibration vectors will be described.

Based on the amplitude value and the phase which are obtained at the time of the rotation speed $n_k$ (k=1 to K) from the output of each of the vibrometers 16 and by the phase calculator 131 respectively, the vibration vector generator 132 generates each vibration value $z_{mk}$ (m=1 to M) in the polar coordinate system shown by the following formula (2) and in the x, y coordinate system shown by the following formulas (3), (4), as an element of a partial vibration vector $Z_k$.

$$z_{mk} = A_{mk}\cdot\exp[j\cdot(\Theta_{mk}\times\pi/180)] = x_{mk} + j\cdot y_{mk} \tag{2}$$

$$x_{mk} = A_{mk}\cdot\cos(\Theta_{mk}\times\pi/180)] \tag{3}$$

$$y_{mk} = A_{mk}\cdot\sin(\Theta_{mk}\times\pi/180)] \tag{4}$$

Note that $A_{mk}$ is the amplitude of the $m^{th}$ vibration value at the time of the rotation speed $n_k$, $\Theta_{mk}$ is the phase [degree] of the $m^{th}$ vibration value at the time of the rotation speed $n_k$, and j is an imaginary unit.

Here, the partial vibration vector $Z_k$ is a column vector of size M with $z_{mk}$ (m=1 to M) being its elements. The vibration vector [Z] is a column vector of size M·K in which the elements of the partial vibration vector [$Z_k$], where k=1 to K, at the time of the rotation speed $n_k$ are arranged vertically. The vibration vectors [Z] generated by the vibration vector generator 132 are loaded and stored in the calculation result storage 125 in sequence.

Next, the second step will be described in which the difference vector calculator 133 calculates the difference vector ΔZ, which is a difference between the vibration vectors Z.

Variations over time of $x_{mk}$ and $y_{mk}$ in a given time width are calculated by the following formulas (5) and (6) respectively, where $x_{mk}$ and $y_{mk}$ are respectively an x-coordinate component and a y-coordinate component of each of the vibration values $z_{mk}$ (m=1 to M, k=1 to K) which are the elements of the vibration vector Z.

$$\Delta x_{mk} = x_{mk}(t+\Delta t) - x_{mk}(t) \tag{5}$$

$$\Delta y_{mk} = y_{mk}(t+\Delta t) - y_{mk}(t) \tag{6}$$

The variation over time can be given by the following formulas (7) and (8) to (10) in the polar coordinate system.

$$\Delta A_{mk} = \sqrt{\left[(\Delta x_{mk})^2 + (\Delta y_{mk})^2\right]} \tag{7}$$

Here, √[x] represents a square root of x.

$$\Phi_m k = 90 - \tan\left[(\Delta x_{mk}/\Delta y_{mk})\cdot(180/\pi)\right] \tag{8}$$

(in the case of $\Delta y_{mk} > 0$)

$$\Phi_m k = 0 \text{ (in the case of } \Delta y_{mk} = 0) \tag{9}$$

$$\Phi_m k = 270 - \tan\left[(\Delta x_{mk}/\Delta y_{mk})\cdot(180/\pi)\right] \tag{10}$$

(in the case of $\Delta y_{mk} < 0$)

The foregoing describes step S21 of calculating the difference vector which is a variation over time of the vibration vector. The difference vectors [ΔZ] calculated by the difference vector calculator 133 are loaded and stored in the calculation result storage 125 in sequence.

Next, the progress controller 137 compares $\Delta A_{mk}$ (m=1 to M, k=1 to K) with a determination reference value $\Delta A_J$, and determines whether or not any of these exceeds the determination reference value $\Delta A_J$ (step S22).

In the case where the progress controller 137 does not determine that any of $\Delta A_{mk}$ exceeds the determination reference value $\Delta A_J$ (NO in step S22), step S12 and step S13 are repeated.

In the case where the progress controller 137 determines that any of $\Delta A_{mk}$ exceeds the determination reference value $\Delta A_J$ (YES in step S22), the unbalance calculator 135 calculates an unbalance position (step S23).

Next to step S23, the progress controller 137 determines whether to continue the operation or not (step S53). In the case where it is determined that the operation is to be continued (YES in step S53), the flow goes to step S11. In the case where it is not determined that the operation is to be continued (NO in step S53), the progress controller 137 executes a process for stopping the operation, for example, issues a stop instruction warning.

Figure 9:
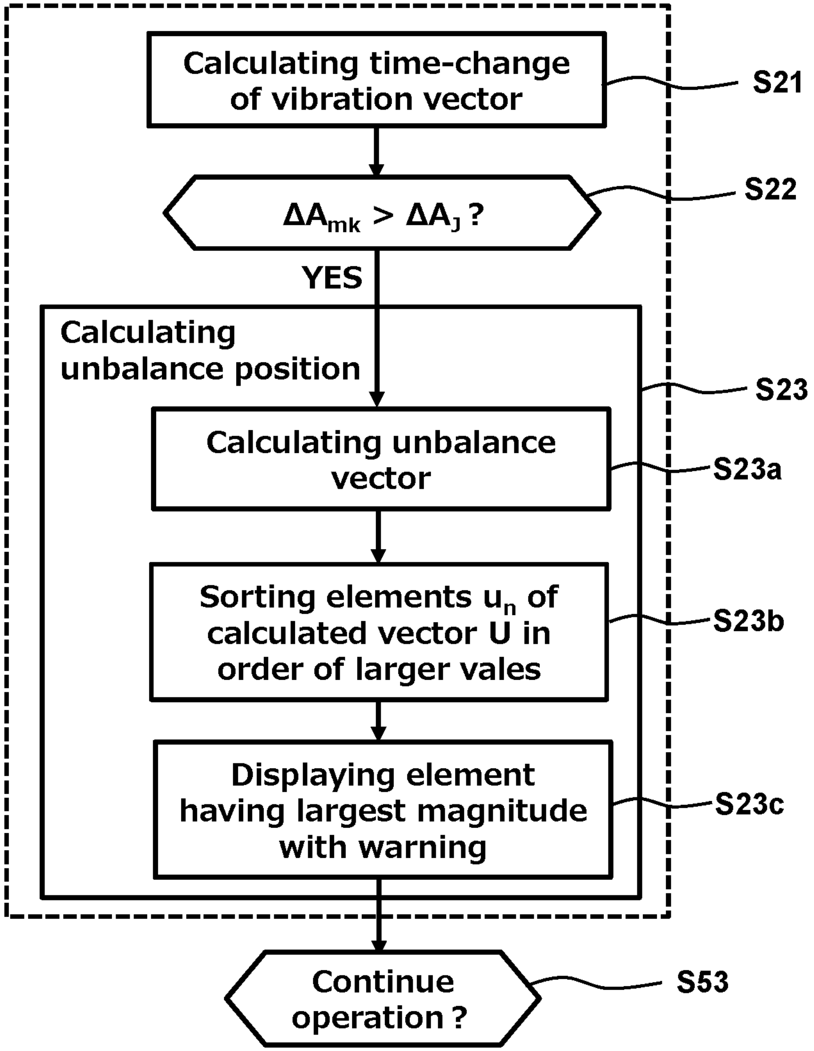
FIG. 9 is a flowchart illustrating details of an unbalance position generating step in a procedure of a diagnostic method during start-up/shut-down process, in the rotary machine diagnostic method according to the first embodiment.

FIG. 9 is a flowchart illustrating details of unbalance position generating step S23 in the procedure of the diagnostic method during start-up/shut-down process, in the rotary machine diagnostic method according to the first embodiment.

In the unbalance position generating step S23, the unbalance calculator 135 first calculates an unbalance vector U (step S23*a*). Specifically, the unbalance calculator 135 calculates the unbalance vector U based on the influence coefficient matrix A read by the input unit 110 and loaded and stored in the influence coefficient matrix storage 122 and the vibration vectors Z stored in the calculation result storage 125.

Here, the unbalance vector U and the influence coefficient matrix A will be first described.

The unbalance vector U is a column vector of size N with unbalance amounts Un at the nodes n (N=1 to N) being its elements.

The influence coefficient matrix A is an (M×N matrix) whose elements are influence coefficients $a_{mn}$ having values of the vibrations occurring at the positions of the $m^{th}$ vibrometers (m=1 to M) when there is a unit unbalance at the node n (n=1 to N).

From this definition, the vibration vector Z, the influence coefficient matrix A, and the unbalance vector U have the relation represented by the following formula (11).

$$Z = A \cdot U \tag{11}$$

The estimation of the unbalance vector U will be described below. In the estimation of the unbalance vector U, either of the following two processes is performed depending on the magnitude relation of the number M of the vibration values obtained by the vibrometers 16 and the number of the nodes n, that is, the number N of the unbalance positions.

The first process is done in the case where the number M of the vibration values is smaller than the number N of the unbalance positions.

First, an error vector E of size M is defined by the following formula (12).

$$E = Zt - Z_m = A \cdot U - Z_m \tag{12}$$

Here, the vibration vector Zt represents a vector of a true vibration value that should be obtained by the formula (11), ascribable to the unbalance vector U, and the vibration vector $Z_m$ represents a vector of the vibration value obtained by the vibrometer 16.

In this case, the error value EE by the following formula (13) is minimized using the least squares method.

$$EE = E * W_1 E + U * W_2 U \tag{13}$$

$W_1$ is, for example, a diagonal matrix, and an unit matrix may be used. The second term is a term for avoiding an unrealistic solution (distribution of U). In the second term, the matrix $W_2$ is a diagonal matrix, and the unit matrix may be first used and the values of the elements may be adjusted according to the result. The elements of the diagonal matrix $W_2$ have a magnitude small enough to ensure calculation accuracy of the unbalance vector U and necessary for the stabilization of the calculation operation.

As a result, the unbalance vector U is obtained by the following formula (14).

$$U = (A * W_1 A + W_2)^{-1} A * W_1 Z_m \tag{14}$$

Here, A* is a conjugate transpose matrix (N×M matrix) of the influence coefficient matrix which is an (M×N matrix).

The second process is done in the case where the number M of the vibration values is larger than the number N of the unbalance positions.

In this case, the error value EE by the following formula (15) is minimized by introducing a Lagrange undetermined multiplier λ.

$$EE = U * W_2 U + \lambda^T (AU - Z_m) \tag{15}$$

As a result, the unbalance vector U is obtained by the following formula (16).

$$U = W_2^{-1} A * \left(A W_2^{-1} A *\right)^{-1} Z_m \tag{16}$$

Next, the elements $u_n$ of the calculated unbalance vector U are coordinate-transformed. That is, XY coordinate values ($u_{nx}$, $u_{ny}$) of the elements $u_n$ of the calculated unbalance vector U are transformed into polar coordinates ($u_{nr}$, $u_{n\Theta}$) by the following formulas (17), (18). Here, $u_{nr}$ is the magnitude of the unbalance and $u_{n\Theta}$ is a circumferential angle of the unbalance place in the case where unbalance positions are concentrated at one point.

$$u_{nr} = \sqrt{\left(u_{nx}^2 + u_{ny}^2\right)} \quad (17)$$

$$\begin{aligned} u_{n\Theta} &= 90 - \tan^{-1}\left[\left(u_{ny}/u_{nx}\right) \times 180/\pi\right] \text{ (in the case of } u_{ny} > 0) \quad (17) \\ &= 270 - \tan^{-1}\left[\left(u_{ny}/u_{nx}\right) \times 180/\pi\right] \text{ (in the case of } u_{ny} < 0) \\ &= 0 \text{ (in the case of } u_{ny} = 0, u_{ny} > 0) \\ &= 180 \text{ (in the case of } u_{ny} = 0, u_{nx} < 0) \quad (18) \end{aligned}$$

Next, the unbalance calculator 135 sorts the magnitudes $u_{nr}$ of the elements $u_n$ of the calculated vector U in the polar coordinate representation in order of larger vales (step S23*b*). The order of the elements $u_n$ of the vector U sorted and rearranged by the unbalance calculator 135 is loaded and stored in the calculation result storage 125. The unbalance calculator 135 outputs the element numbers n of the elements $u_n$ of the vector U and their magnitudes $u_{nr}$ and circumferential angles $u_{n\Theta}$ in this order to the output unit 140.

The output unit 140 receiving them gives a caution to an operator or the like (step S23*c*). In more detail, regarding the element number n having the largest magnitude, the output unit 140 displays information including the position, the magnitude $u_{nr}$, and the circumferential angle $u_{n\Theta}$ of the node n of this element together with the warning.

The foregoing is the procedure of diagnosis step S20 during start-up/shut-down process, and next, diagnosis step S30 during rated rotation speed operation will be described with reference to FIG. 8.

In the case where it is determined that the rotary machine 10 is in rated rotation speed operation (YES in step S13), the input unit 110 reads the power of the rotary machine 10, that is, the load (step S31). Here, the power in the case where the rotary machine 10 is the steam turbine and the power generator illustrated in FIG. 2 can be an output of a trade wattmeter or a first-stage pressure of the steam turbine.

Next, the rotary machine diagnostic device 100 calculates a change in the vibration vector (step S32). In more detail, the vibration vector generator 132 generates the vibration vectors and the difference vector calculator 133 calculates a difference between the vibration vectors. The specific contents of these are the same as those in step S21 and a description thereof will be omitted.

Next, the rotary machine diagnostic device 100 specifies a failure occurrence place and infers a failure cause (step S40). Details of step S40 will be described below with reference to FIG. 10 to FIG. 13 in sequence.

Figure 10:
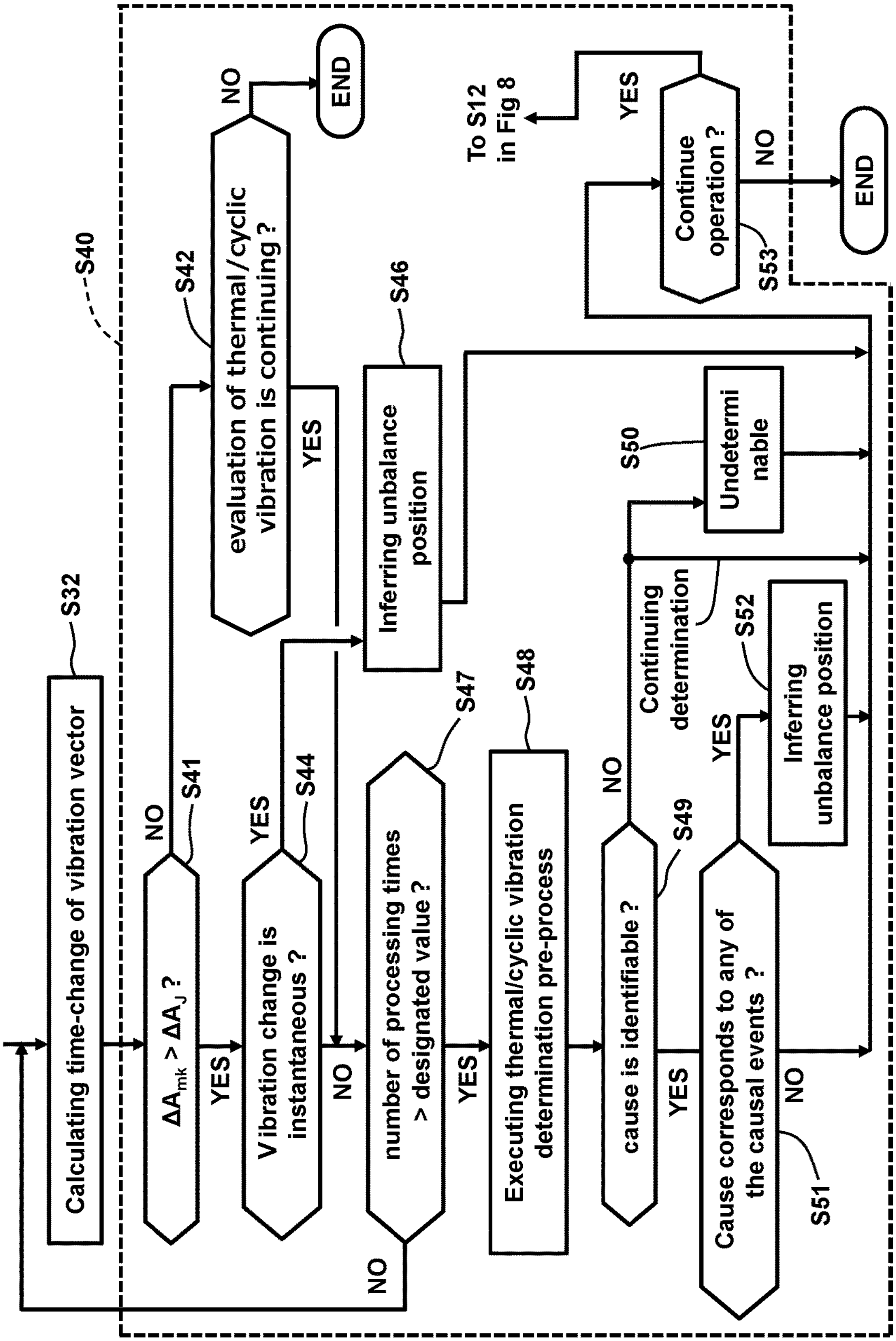
FIG. 10 is a flowchart illustrating a procedure of a failure occurrence place specifying and diagnosing method during rated rotation speed operation, in the rotary machine diagnostic method according to the first embodiment.

FIG. 10 is a flowchart illustrating a procedure of a failure occurrence place specifying and diagnosing method during rated rotation speed operation (step S40), in the rotary machine diagnostic method according to the first embodiment.

First, the rotary machine diagnostic device 100 determines whether the change in the vibration vector is large or not (step S41). Specifically, the progress controller 137 compares $\Delta A_{mk}$ (m=1 to M, k=1 to K) with a determination reference value $\Delta A_{LJ}$ and determines whether or not any of these exceeds the determination reference value $\Delta A_{LJ}$.

In the case where the progress controller 137 determines in step S41 that any of $\Delta A_{mk}$ (m=1 to M, k=1 to K) exceeds the determination reference value $\Delta A_{LJ}$ (YES in step S41), the flow goes to the next step S44 of determining whether or not this vibration change is instantaneous. Step S44 of determining whether or not the vibration change is instantaneous will be described later.

In the case where the progress controller 137 does not determine in step S41 that any of $\Delta A_{mk}$ (m=1 to M, k=1 to K) exceeds the determination reference value $\Delta A_{LJ}$ (NO in step S41), the progress controller 137 determines whether the evaluation of thermal/cyclic vibration is continuing (step S42). The determination on the thermal/cyclic vibration will be described in step S49 to be described later.

In the case where the progress controller 137 determines in step S42 that the evaluation of the thermal/cyclic vibration is continuing (YES in step S42), the flow goes to step S47 to be described later.

In the case where the progress controller 137 does not determine in step S42 that the evaluation of the thermal/cyclic vibration is continuing (NO in step S42), the number of processing times in step S47 to be described later is reset, and an END process is performed because there is no problem.

The aforesaid step S44 of determining whether or not the change is instantaneous will be described in detail. First, based on the vibration vectors that the vibration vector generator 132 generate at the sampling intervals, the difference vector calculator 133 calculates the difference vector. The contents of this are the same as those in step S21 and a detailed description thereof will be omitted. Next, using a threshold value for the determination of a vector instantaneous variation, the progress controller 137 determines whether or not the variation is equal to or more than the threshold value.

In the case where the progress controller 137 determines in step S44 that the variation is equal to more than the threshold value, using the threshold value for the determination of the vector instantaneous variation (YES in step S44), the unbalance position is inferred (step S46). The specific contents thereof are the same as those in step S23, and a detailed description thereof will be omitted.

In the case where the progress controller 137 does not determine in step S44 that the variation is equal to or more than the threshold value, using the threshold value for the determination of the vector instantaneous variation (NO in step S44), the flow goes to the determination on whether or not a vibration mode of thermal vibration or cyclic vibration is occurring in the rotating part 10*a* of the rotary machine 10 and the identification of the vibration mode.

First, it is determined whether or not the number of processing times is equal to or more than a designated value (step S47). In more detail, the progress controller 137 determines whether or not the number of processing times is equal to or more than the designated value for determination.

In the case where the progress controller 137 does not determine that the number of processing times is equal to or more than the designated value for determination (NO in step S47), the flow returns to step S32 and the process is repeated. The progress controller 137 counts the number of times reaching step S47 as the number of processing times.

The thermal vibration and the cyclic vibration are characterized in that values of the amplitude and the phase continuously change with time. Therefore, the determination of the thermal vibration or the cyclic vibration requires continuously measured data over, for example, about one hour. If the designated value for the determination is too small, data sufficient for the determination cannot be obtained. On the other hand, if the designated value is too large, a lot of time is required up to the determination, leading to a risk of trouble expansion. Therefore, as the designated value, a value within an appropriate range is selected in consideration of both.

In the case where the progress controller 137 determines that the number of processing times is equal to or more than the designated value for determination (YES in step S47), a thermal/cyclic vibration determination pre-process is executed (step S48). Specifically, the polar diagram data generator 134 generates data for polar diagram generation, and the generated data for polar diagram generation is loaded and saved in the calculation result storage 125 as data of the vibration mode. Further, the output unit 140 displays the polar diagram or outputs numerical data for graphic display.

Next, it is determined whether or not a cause is identifiable (step S49). Specifically, using the identified vibration mode loaded and saved in the calculation result storage 125, the failure cause inferring part 136 evaluates and determines the cause based on, for example, the polar diagram obtained in step S48. In the following, the case where the cause evaluation and determination are based on the polar diagram will be described.

Figure 11:
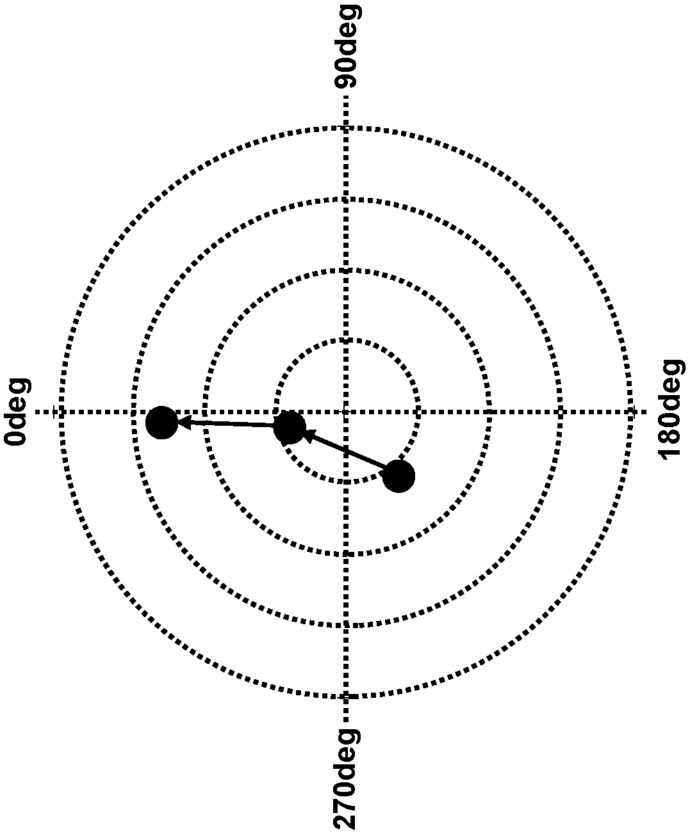
FIG. 11 is a display example of a polar diagram in the case of thermal vibration, obtained in the procedure of the failure occurrence place specifying and diagnosing method during rated rotation speed operation, in the rotary machine diagnostic method according to the first embodiment.

FIG. 11 is a display example of a polar diagram in the case of the thermal vibration which diagram is obtained in the procedure of the failure occurrence specifying and diagnosing method during rated rotation speed operation, in the rotary machine diagnostic method according to the first embodiment. The black circles correspond to the vibration vectors, each of which extends from the origin to each of the black circles, generated by the vibration vector generator 132 at points in time. The arrows correspond to the difference vectors calculated by the difference vector calculator 133. Note that the values at the points in time each may be a value obtained in each sampling interval of the vibration value or may be a value obtained in each predetermined interval. That is, the change in the vector is the difference vector $\Delta Z$ or the resultant of the different vectors obtained a predetermined number of times. The difference vector per unit time in both cases will be comprehensively represented by a vector change v. Further, a rate of change of a direction of the vector change v will be represented by a direction change rate $\beta$. This also applies to FIG. 12 and FIG. 13.

In the thermal vibration shown by the polar diagram in FIG. 11, the magnitude of the vector change v is equal to or more than a predetermined value and the direction change rate $\beta$ of the vector is equal to or less than a predetermined value. Further, on the polar diagram, the phase keeps changing and the plots depict a non-rotating orbit. The failure cause inferring part 136 determines whether or not the vibration is the thermal vibration, using the stored identification value for determination.

Figure 12:
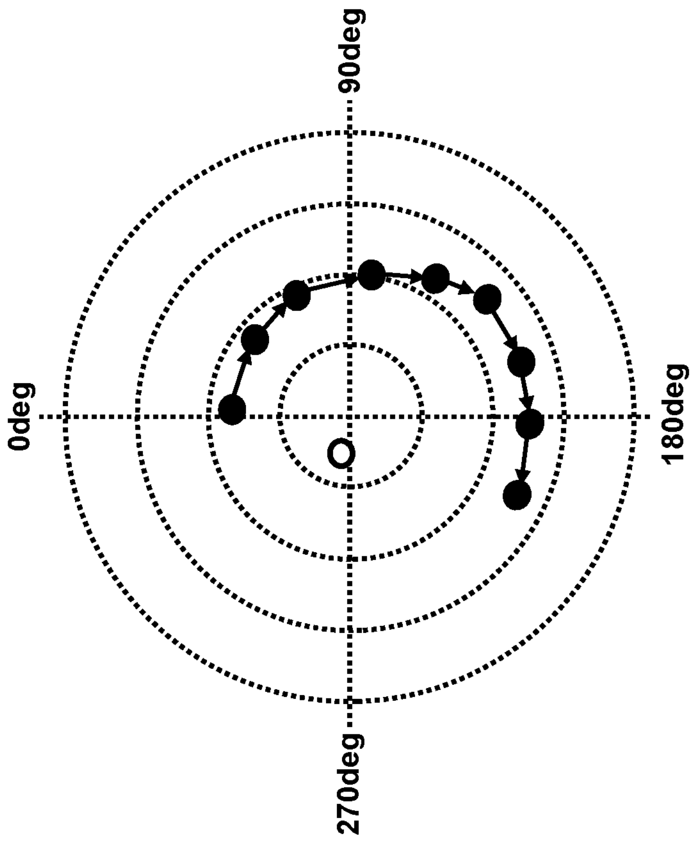
FIG. 12 is a display example of a polar diagram in the case of cyclic vibration by a hard rub, obtained in the procedure of the failure occurrence place specifying and diagnosing method during rated rotation speed operation in the rotary machine diagnostic method according to the first embodiment.

FIG. 12 is a display example of a polar diagram in the case of the cyclic vibration by a hard rub which diagram is obtained in the failure occurrence place specifying and diagnosing method during rated rotation speed operation, in the rotary machine diagnostic method according to the first embodiment.

As illustrated in FIG. 12, the feature of the cyclic vibration by a hard rub is that on the polar diagram, the phase keeps changing and the plots depict a rotating orbit, and the magnitude of the vector change varies as the time elapses, that is, this is a state in which the plots become larger or smaller in the radial direction spirally.

The failure cause inferring part 136 determines whether or not the condition is satisfied that the magnitude of the vector change v is equal to or more than a predetermined value, a direction change rate $\beta$ of the vector is equal to or more than a predetermined value, and a direction change acceleration $\alpha$ of the vector, that is, a time derivative value of the direction change rate $\beta$ of the vector is equal to or more than a predetermined value.

Figure 13:
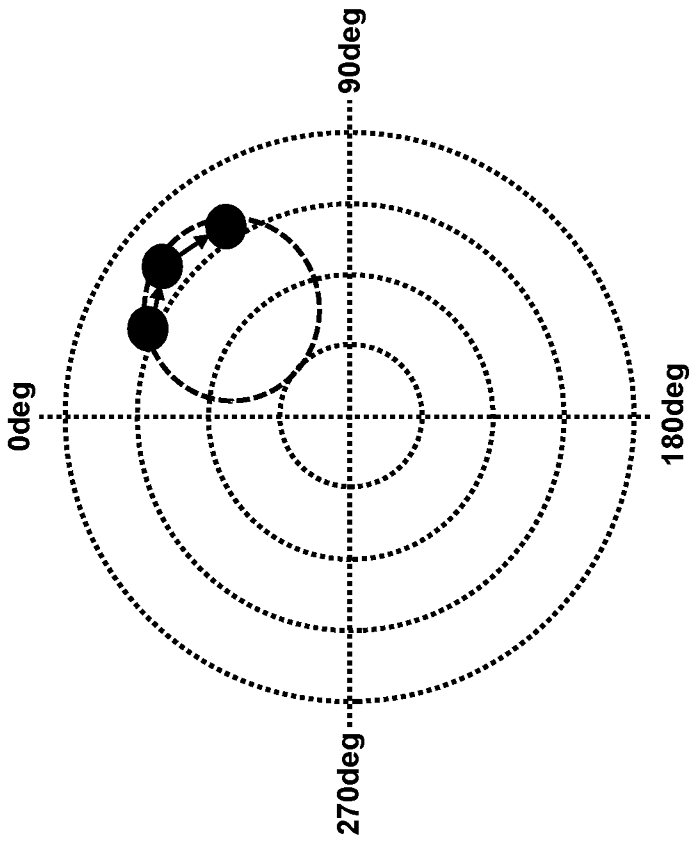
FIG. 13 is a display example of a polar diagram in the case of cyclic vibration by a soft rub, obtained in the procedure of the failure occurrence place specifying and diagnosing method during rated rotation speed operation, in the rotary machine diagnostic method according to the first embodiment.

FIG. 13 is a display example of a polar diagram in the case of the cyclic vibration by a soft rub which diagram is obtained in the procedure of the failure occurrence place specifying and diagnosing method during rated rotation speed operation, in the rotary machine diagnostic method according to the first embodiment.

As illustrated in FIG. 13, the feature of the cyclic vibration by a soft rub is that on the polar diagram, the phase keeps changing and the plots depict a rotating orbit, and the magnitude of a vector change with time is small, that is, the plots are on the same circular orbit.

The failure cause inferring part 136 determines whether or not the condition is satisfied that the magnitude of the vector change v is equal to or more than the predetermined value, the direction change rate $\beta$ of the vector is equal to or more than the predetermined value, and the direction change acceleration $\alpha$ of the vector is equal to or less than the predetermined value.

The failure cause inferring part 136 identifies the cause as required also in cases other than the aforesaid three cases.

In the above, the determination by the failure cause inferring part 136 has been described with reference to the polar diagrams illustrated in FIG. 11 to FIG. 13 for convenience of the description. The polar diagram is displayed by the output unit 140 to help the operator or the like for better understanding but is not always required for the determination by the failure cause inferring part 136. The failure cause inferring part 136 is capable of direct identification, using the vibration vectors generated by the vibration vector generator 132 and stored in the calculation result storage 125 and the difference vector calculated by the difference vector calculator 133 and stored in the calculation result storage 125.

The progress controller 137 determines that the cause is identifiable in the case where the identification by the failure cause inferring part 136 corresponds to any of the above. Further, in the case where the identification by the failure cause inferring part 136 does not correspond to any of the above, the progress controller 137 does not determine that the cause is identifiable.

In the case where the progress controller 137 does not determine in step S49 that the cause is identifiable (NO in step S49), information of being undeterminable is output to the output unit 140, and the output unit 140 displays the contents to this effect (step S50). Thereafter, the flow goes to step S53. Alternatively, it may go directly to step S53 from step S49, and the identification may be continued.

In the case where the progress controller 137 determines in step S49 that the cause is identifiable (YES in step S49), it is determined whether the cause corresponds to any of the causal events (step S51). That is, the progress controller 137 determines whether or not the cause is identified as corresponding to any of the cases illustrated in FIG. 11 to FIG. 13 as a result of the determination by the failure cause inferring part 136.

In the case where the progress controller 137 determines in step S51 that the cause corresponds to any of the causal events (YES in step S51), the unbalance position is inferred (step S52). The inference of the unbalance position is the same as the contents of the calculation of the unbalance position in step S23, and a detailed description thereof will be omitted. After the unbalance position is inferred in step S52, the flow goes to step S53.

In the case where the progress controller 137 does not determine in step S51 that the cause corresponds to any of the causal events (NO in step S51), the flow directly goes to step S53.

In step S53, it is determined whether to continue the operation or not. Usually, when an abnormality occurs, the operation regarding the rotary machine 10 is not continued and the operation is stopped, but the determination step is provided to make sure. In this step, using a user interface, the operator may perform a shutdown operation in response to the state display. Alternatively, automatic operation continuation and automatic shutdown may be classified by each cause. In the case of the operation continuation (YES in step S53), the flow goes to step S12 in FIG. 8.

As described above, both while the rotation speed of the rotary machine 10 is changing and while the rotary machine 10 is in rated rotation speed operation, it is possible to specify a failure occurrence place and infer a failure cause, regarding an unbalance occurrence event of the rotating part 10_a_.

Second Embodiment

Figure 14:
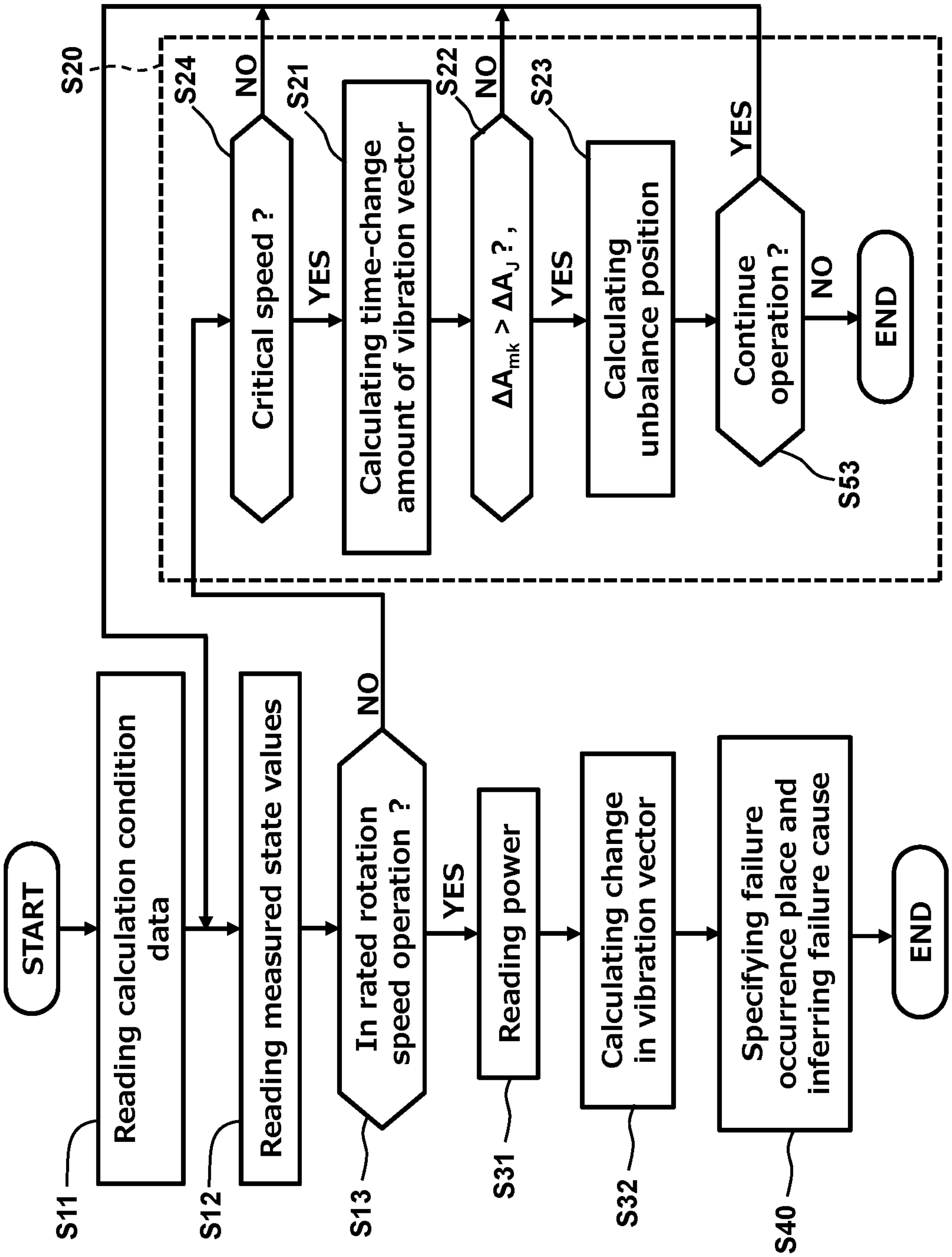
FIG. 14 is a flowchart illustrating the whole procedure of a rotary machine diagnostic method according to a second embodiment.

FIG. 14 is a flowchart illustrating the whole procedure of a rotary machine diagnostic method according to a second embodiment.

This embodiment is characterized in that a vibration vector when the rotation speed of the rotating part 10_a_ changes to reach a critical speed is extracted and evaluated. Therefore, before step S21, a step of determining whether or not the rotation speed of the rotating part 10_a_ is a critical speed (S24) is added.

When the rotating speed is increasing, a typical operation is to have the rotation speed pass the critical speed without stopping the increase in the rotation speed at an instant when the rotation speed of the rotating part 10_a_ reaches the critical speed. However, if a sampling interval is rough, it is difficult to collect data at an instant when the rotation speed actually matches the critical speed. Further, values of amplitude and phase greatly change at the time of the critical speed, which involves a concern about the worsening of final detection accuracy if data before or after the time of the critical speed is used as an alternative.

With such as background, the progress controller 137 determines that the rotation speed of the rotating part 10_a_ received by the input part 110 has passed the critical speed, and the failure cause inferring part 136 makes interpolation using the result that the vibration vector generator 132 obtains before or after the rotation speed passes the critical speed, and calculates the amplitude and the phase at the time of the critical speed.

In this embodiment, since the evaluation is made when the rotation speed reaches the critical speed at which the amplitude value is large, sensitivity to a vibration change when an unbalance failure event of the rotating part 10_a_ occurs is high, leading to higher detection accuracy. It is also possible to reduce the volume of measurement data saved in the storage unit 120.

Third Embodiment

Figure 15:
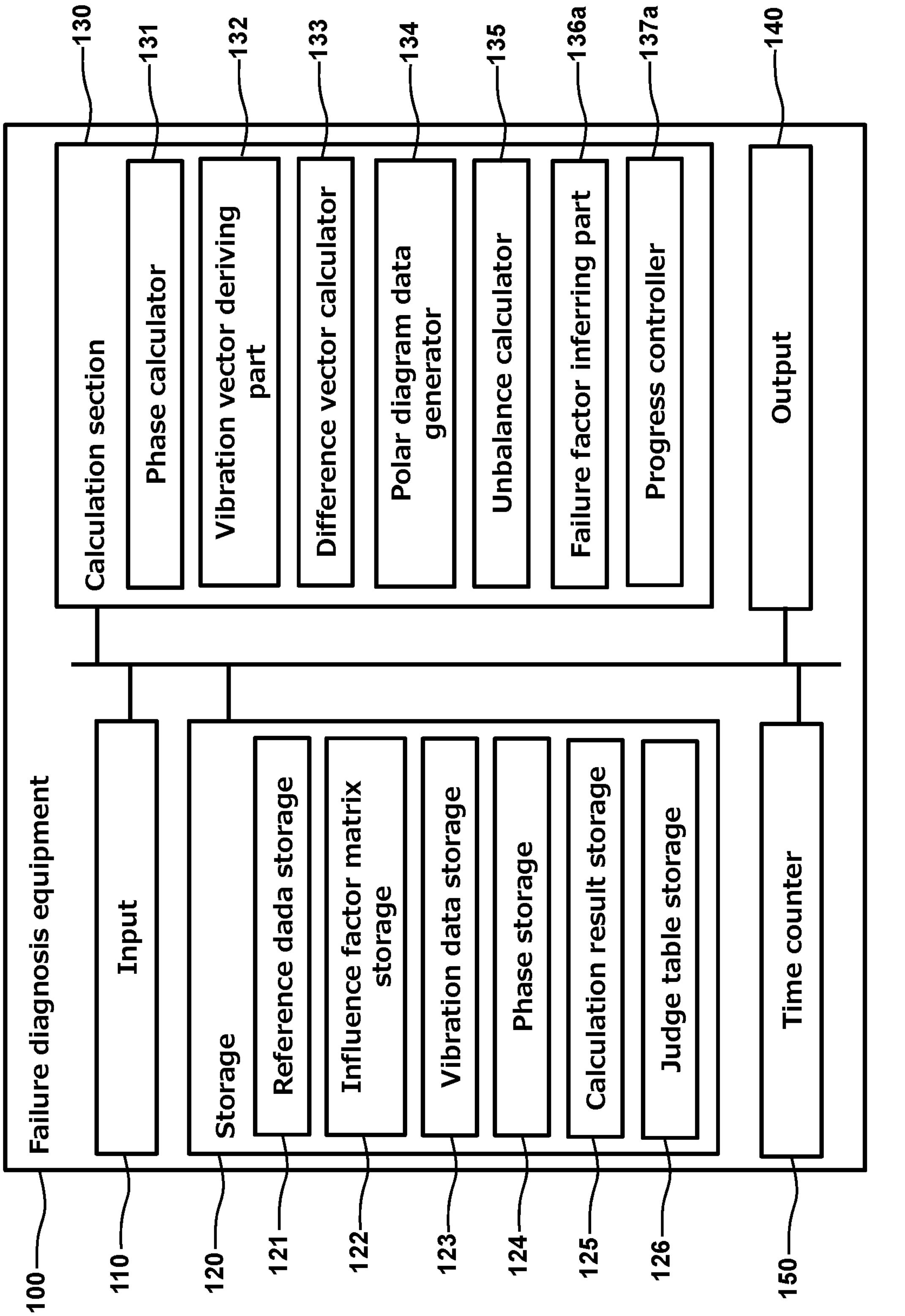
FIG. 15 is a block diagram illustrating the configuration of a rotary machine diagnostic device according to a third embodiment.

FIG. 15 is a block diagram illustrating the configuration of a rotary machine diagnostic device 100_a_ according to a third embodiment. In this embodiment, which is a modification of the first embodiment, a vibration mode is identified and a failure cause is inferred, using a moving speed, a movement acceleration, and a direction change rate of a vibration vector instead of based on the polar diagrams used in the first embodiment.

In the rotary machine diagnostic device 100_a_, a storage unit 120 further has a determination table storage 126, and the calculation unit 130 further has a data processing part 138, has a failure cause inferring part 136_a_ instead of the failure cause inferring part 136, and has a progress controller 137_a_ instead of the progress controller 137. The determination table storage 126 stores determination tables. The determination tables include a first determination table 126_a_, a second determination table 126_b_, and a third determination table 126_c_ which will be described later.

First, a process by the data processing part 138 will be described below.

(1) Before the calculation of an average value of phase data, the following pre-process is executed to avoid the average value reaching an abnormal value when 0 degrees (360 degrees) is between the phases.

Let the phase data to be averaged be $\Theta_1, \Theta_2, \ldots, \Theta_N$ in time series, and the following processes are performed in sequence for i=2 to N.

In the case of $\Theta_i - \Theta_{i-1} > 180$ degrees, $\Theta_i$ is replaced by the following.

$$\Theta_i - 360 \times \mathrm{int}((\Theta_i - \Theta_{i-1} + 180)/360)$$

In the case of $\Theta_i - \Theta_{i-1} < 180$ degrees, $\Theta_i$ is replaced by the following.

$$\Theta_i + 360 \times \mathrm{int}((\Theta_i - \Theta_{i-1} + 180)/360)$$

In neither case, $\Theta_i$ is left as it is.

Note that int(x) represents the maximum integer not exceeding x.

(2) Average values of the amplitude "a" and the phase Θ are calculated from data obtained in the past N-time processes. Here, m represents the number assigned to the data at the current time. As the phase Θ, the value resulting from the pre-process in (1) is used.

The number of data to be averaged is a value of Ave_Count and is represented by N in the following formulas (19), (20).

$$a = \sum a_i / N \quad (19)$$

$$\Theta = \sum \Theta i / N \quad (20)$$

Here, Σ means the sum of the values for i=m−N+1 up to i=m.

(3) The amplitude "a" and the phase Θ resulting from the averaging are transformed into values X, Y of the orthogonal coordinate system by the following formulas (21), (22).

$$X = a \times \cos(\Theta \times \pi / 180) \quad (21)$$

(4) From the found average values, a vibration vector change is calculated by the following formulas (23), (24)

$$\Delta X_i = X_i - X_{i-1} \quad (23)$$

$$\Delta Y_i = Y_i - Y_{i-1} \quad (24)$$

Figure 16:
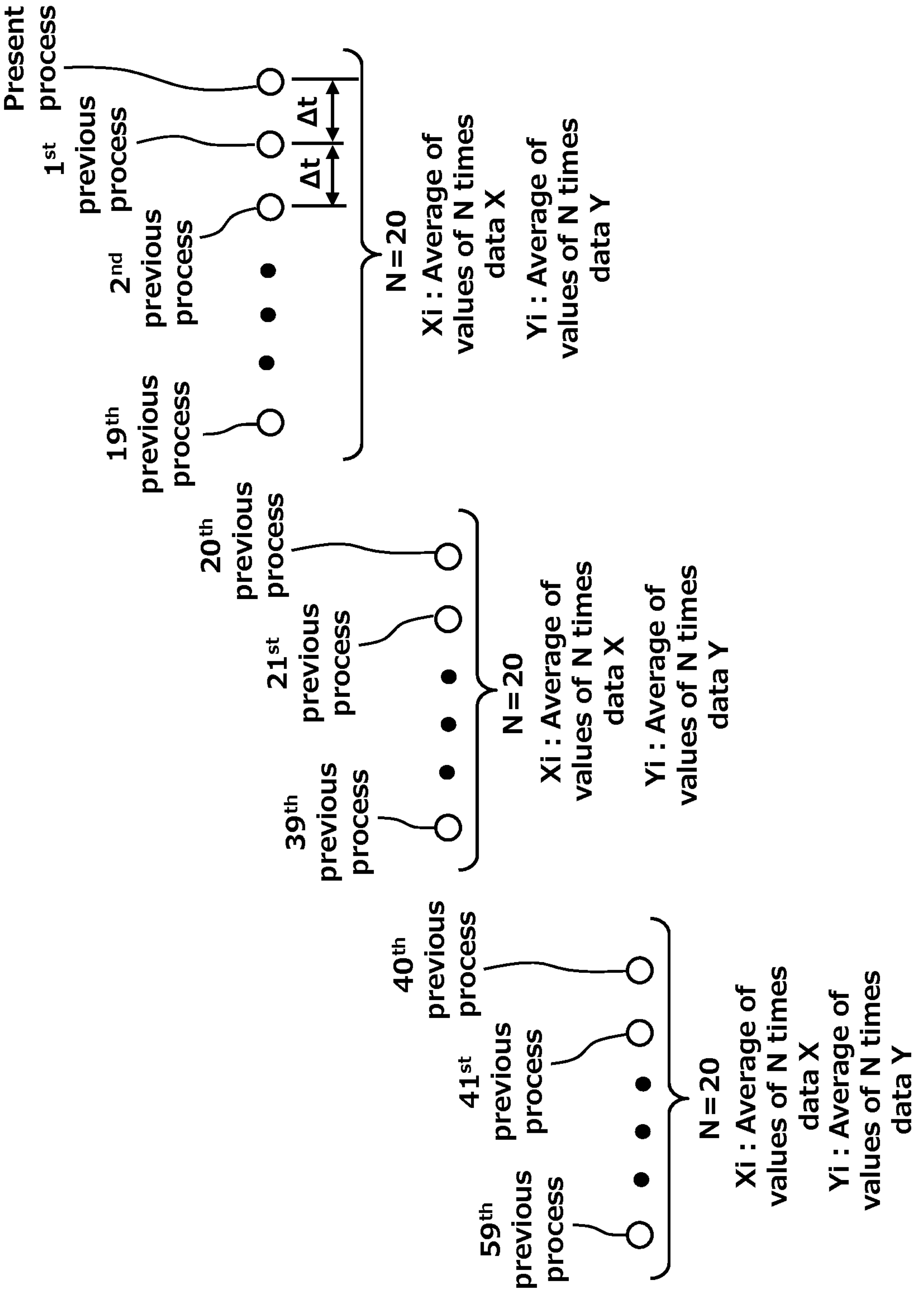
FIG. 16 is an explanatory chart of a process by a data processing part, in a rotary machine diagnostic method according to the third embodiment.

FIG. 16 is an explanatory chart of the process by the data processing part 138, in the rotary machine diagnostic method according to the third embodiment.

For example, in the case of N=20, Xi and $Y_i$ are averages of values of 20 times data from the nineteenth previous process up to the present process, that is, averages of values obtained in twenty processes. $X_{i-1}$ and $Y_{i-1}$ are averages of values of 20 times data from the thirty-ninth previous process up to the twentieth previous process from the present process, that is, averages of values obtained in twenty processes, $X_{i-2}$ and $Y_{i-2}$ are averages of values of 20 times data from the fifty-ninth previous process up to the fortieth previous process, that is, averages of values obtained in twenty processes, and ΔX and ΔY are differences therebetween.

(5) The moving speed $v_i$ (the magnitude of the vector change) and the acceleration $\alpha_i$ on the polar diagram are calculated by the following formulas (25) to (27).

$$v_i = (\sqrt{[\Delta X_1)^2 + (\Delta Y_i)^2]})/(N \cdot \Delta t) \quad (25)$$

$$v_{i-1} = (\sqrt{[\Delta X_{i-1})^2 + (\Delta Y_{i-1})^2]})/(N \cdot \Delta t) \quad (26)$$

$$a_i = (v_i - v_{i-1})/N \cdot \Delta t) \quad (27)$$

Note that Δt is a data sampling period (unit:minute) and N is the number of data to be averaged.

(6) A vector change direction $\phi_i$ and a direction change rate $\beta_i$ are calculated.

From $\Delta X_i$ and $\Delta Y_i$ obtained in (4) described above, the vector change direction $\phi_i$ is calculated by the following formula (28).

$$\begin{aligned} \phi_i &= 90 - \tan^{-1}[(\Delta X_i/\Delta Y_i) \times 180/\pi)] \text{ (in the case of } \Delta Y_i > 0) \quad (28) \\ &= 270 - \tan^{-1}[(\Delta X_i/\Delta Y_i) \times 180/\pi)] \text{ (in the case of } \Delta Y_i < 0) \\ &= 0 \text{ (in the case of } \Delta Y_i = 0, \Delta X_i > 0) \\ &= 180 \text{ (in the case of } \Delta Y_i = 0, \Delta X_i < 0) \end{aligned}$$

A change $\Delta\phi_i$ in the direction is calculated by the following formula (29), considering the case where 0 degrees (360 degrees) is present between the directions.

$$\begin{aligned} \Delta\phi_i &= \phi_i - \phi_{i-1} \text{ (in the case of } -180 \le \phi_i - \phi_{i-1} \le 180) \quad (29) \\ &= \phi_i - \phi_{i-1} - 360 \text{ (in the case of } \phi_i - \phi_{i-1} > 180) \\ &= \phi_i - \phi_{i-1} + 360 \text{ (in the case of } \phi_i - \phi_{i-1} < 180) \end{aligned}$$

From the obtained $\Delta\phi_i$, the direction change rate $\beta_i$ per unit time (for example, one minute) is calculated by the following formula (30).

$$\beta_i = \Delta\Phi_i/(N \cdot \Delta t) \quad (30)\text{n}$$

FIG. 17 is the first determination table 126*a* showing determination conditions in the failure occurrence place specifying and diagnosing method during rated rotation speed operation, in the rotary machine diagnostic method according to the third embodiment. The first determination table 126*a* is stored in the determination table storage 126. This determination table is used at a stage corresponding to step S49 in FIG. 10.

The determination is made according to the first determination table 126*a*, using the moving speed $v_i$, the direction change rate $\beta_i$ of the vibration vector, and the movement acceleration $\alpha_i$, which are obtained as described above, on the polar diagram.

In the first column of the first determination table 126*a*, the items, "Thermal vibration", "Cyclic vibration (Hard rub, Soft rub)", and "Correspond to none" are categories of the cause. The second column to the fourth column show the moving speed $v_i$, the direction change rate $\beta_i$, and the movement acceleration $\alpha_i$ which are determination parameters. The fifth column to the seventh column show the determination results. In the first determination table 126*a*, "Add 1" means to add 1 to the previous determination result read as an input value. That is, the numerical values of the determination results each indicate the number of times the determination continuously turns out to be the relevant vibration.

Threshold values ($v_0$, $\beta_0$, $\alpha_0$) used for the determination can be set separately for the individual vibrometers 16.

The failure cause inferring part 136*a* performs the determination process as follows according to the first determination table 126*a* illustrated in FIG. 17. Here, the failure cause inferring part 136*a* stores the counts of the thermal vibration determination, the cyclic vibration (hard rub) determination, and the cyclic vibration (soft rub) determination individually for each of the vibrometers 16.

(1) In the case of $v_i \ge v_{t0}$ and $\beta_i \le \beta_0$, 1 is added to the value of the thermal vibration determination.

(2) In the case of $v_i \ge v_{c0}$, $\beta_i \ge \beta_0$, and $\alpha_i \ge \alpha_0$, 1 is added to the value of the cyclic vibration (hard rub) determination.

(3) In the case of $v_i \ge v_{c0}$, $\beta_i \ge \beta_0$, and $\alpha_i < \alpha_0$, 1 is added to the value of the cyclic vibration (soft rub) determination.

(4) The determination in the case of ($v_i < v_{t0}$, $\beta_i < \beta_0$) or ($v_i < v_{c0}$, $\beta_i \ge \beta_0$) is correspond to none.

FIG. 18 is a second determination table 126*b* showing determination conditions in the failure occurrence place specifying and diagnosing method during rated rotation speed operation, in the rotary machine diagnostic method according to the third embodiment.

The second determination table 126*b* complements the conditions used for the determination in step S49 using the first determination table 126*a*. Specifically, in the thermal vibration determination, the maximum value of the thermal vibration determination results in the bearings and directions is used. In the cyclic vibration (hard rub) determination, the maximum value of the cyclic vibration (hard rub) determination results in the bearings and directions is used. In the cyclic vibration (soft rub) determination, the maximum value of the cyclic vibration (soft rub) determination results in the bearings and the directions is used. Further, processes of the above determinations are the following (a) and (b).

(a) In the above-described three determination results, if the number of the 0 determinations is 0 or 1, this is a state in which the determination result indicates that vibration events of two or all of the thermal vibration, the cyclic vibration (hard rub), and the cyclic vibration (soft rub) are occurring. In this case, 1 is added to "x" of the determination in the cause evaluation. This state corresponds to "1 or 2" in "Determination result in case evaluation" in the third determination table 126*c* illustrated in FIG. 19, and the process in this state corresponds to "Output Nothing done" for follow-up observation. Thereafter, the evaluation cycle is repeated again, and when the result turns out to be this determination three times, the process for "Output Determinable" is performed.

(b) In the above-described three determination results, in the case where the number of the 0 determinations is 2 or 3, the determination result is 0. In this case, the determination turns out that only one of the thermal vibration, the cyclic vibration (hard rub), and the cyclic vibration (soft rub) is occurring or none of these is occurring. This case corresponds to "0" as X in "Determination results in case evaluation" in the third determination table 126*c* illustrated in FIG. 19, and the determination is newly made.

FIG. 19 is the third determination table 126*c* showing determination conditions in the failure occurrence place specifying and diagnosing method during rated rotation speed operation, in the rotary machine diagnostic method according to the third embodiment.

The progress controller 137*a* makes comprehensive determination as follows according to the third determination table 126*c* illustrated in FIG. 19 based on the determination results that are based on the first determination table 126*a* and the second determination table 126. That is, the third determination table 126*c* is used at a stage corresponding to step S51 in FIG. 10.

The third determination table 126*c* illustrated in FIG. 19 shows an example regarding the thermal vibration, and for the cyclic vibration (soft rub) and the cyclic vibration (hard rub), similar tables are prepared, but a description thereof will be omitted. In the following, an example regarding the thermal vibration will be described.

The first column of the third determination table 126*c* is the determination result in the cause evaluation regarding the thermal vibration in step S49, and the rows therein are classifications of the number of times of the thermal vibration determinations. The second column shows the determination results of vibrations other than the thermal vibration. The third column shows processes for the respective cases.

In the case where the determination results regarding the thermal vibration are 0 in all the bearings and directions, the process performed when the cyclic vibration (hard rub) determination is 0, the cyclic vibration (soft rub) determination is 0, and the thermal vibration determination is 0 corresponds to "Output nothing done". Further, the process performed when the cyclic vibration (hard rub) determination is larger than 0, the cyclic vibration (soft rub) determination is larger than 0, or the thermal vibration determination is larger than 0 is to proceed to the unbalance position inferring step.

The process performed when the number of times of the thermal vibration determinations is 1 or 2 in all the bearings and directions corresponds to "Output nothing done".

The process performed when the number of times of the thermal vibration determinations is 3 or more in all the bearings and directions corresponds to "Output undeterminable".

The process performed when the number of times of the determinations for the relevant event is 1 or 2 in all the bearings and directions corresponds to "Output nothing done".

The process performed when the number of times of the determinations for the relevant event is 3 or more in all the bearings and directions corresponds to "Output undeterminable".

The above-described determination results of the vibration mode based on the first determination table 126*a*, the second determination table 126*b*, and the third determination table 126*c* are loaded and saved in the calculation result storage 125 and can be output and displayed by the output unit 140.

As described above, in this embodiment, the determination tables are stored, which enables efficient determination.

According to the embodiments described hitherto, it is possible to provide a rotary machine diagnostic device and a rotary machine diagnostic method capable of specifying a failure occurrence place and inferring a failure cause, regarding an unbalance occurrence event of a rotor.

Other Embodiments

While certain embodiments have been described, these embodiments have been presented by way of example only, and are not intended to limit the scope of the inventions. Since the configurations of the embodiments are not contradictory to one another, the features of two or more or all of the embodiments may be combined. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A rotary machine diagnostic device for specifying a failure occurrence place and inferring a failure cause, regarding an unbalance occurrence event that a rotating part included in a rotary machine undergoes during a period when the rotating part is rotating, wherein vibrometers are disposed near bearings of the rotary machine, and a phase detector and a rotation counter are provided to face the rotating part of the rotary machine, the device comprising:

an input unit that receives an influence coefficient matrix data for an influence coefficient matrix, vibration data output by the vibrometers, a rotation speed data of the rotating part output by the rotation counter, and phase calculation data of the rotating part output by the phase detector serving as a basis for phase calculation of phase of the rotating part;

a calculation unit that performs a calculation operation of calculating the phase based on the phase calculation data received by the input unit comprising:

generating vibration vectors based on the phase and the vibration data, calculating a moving speed, a difference vector, and a direction change rate based on the vibration vectors, identifying a vibration mode among a plurality of vibration modes serving as a basis for the specification of the inference of the failure cause, based on the moving speed, the difference vector, and the direction change rate, and identifying the failure occurrence place by calculating an unbalance distribution of the rotating part based on the vibration vectors and the influence coefficient matrix;

and an output unit that displays the failure occurrence place calculated by the calculation unit, and displays an information regarding the failure cause based on the vibration mode identified by the calculation unit.

2. The rotary machine diagnostic device according to claim 1, wherein the period when the rotating part is rotating is a period when the rotating part included in the rotary machine is rotating when a rotation speed of the rotary machine passes a critical speed.

3. A rotary machine diagnostic method for specifying a failure occurrence place and inferring a failure cause, regarding an unbalance occurrence event that a rotating part included in a rotary machine undergoes during a period when the rotating part is rotating, wherein vibrometers are disposed near bearings of the rotary machine, and a phase detector and a rotation counter are provided to face the rotating part of the rotary machine, the method comprising:

a first input step of receiving an influence coefficient matrix data for an influence coefficient matrix, by an input unit;

a second input step of receiving vibration data output by the vibrometers, a rotation speed data of the rotating part output by the rotation counter, and phase calculation data of the rotating part output by the phase detector serving as a basis for calculation of phase of the rotating part, by the input unit;

a calculation step of performing calculation operation of calculating the phase based on the phase calculation data received by the input unit comprising:

generating vibration vectors based on the phase and the vibration data, calculating a moving speed, a difference vector, and a direction change rate based on the vibration vectors, identifying a vibration mode among a plurality of vibration modes serving as a basis for the specification of the inference of the failure cause, based on the moving speed, the difference vector, and the direction change rate, and identifying the failure occurrence place by calculating an unbalance distribution of the rotating part based on the vibration vectors and the influence coefficient matrix, by a calculation unit;

and a displaying step of displaying the failure occurrence place calculated by the calculation unit, and displaying an information regarding the failure cause based on the vibration mode identified by the calculation unit.

* * * * *